(12) United States Patent
Katagiri

(10) Patent No.: US 10,983,653 B2
(45) Date of Patent: Apr. 20, 2021

(54) CONDUCTIVE FILM, TOUCH PANEL, AND METHOD FOR MANUFACTURING CONDUCTIVE FILM

(71) Applicant: FUJIFILM Corporation, Tokyo (JP)

(72) Inventor: Kensuke Katagiri, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/701,766

(22) Filed: Dec. 3, 2019

(65) Prior Publication Data

US 2020/0103996 A1 Apr. 2, 2020

Related U.S. Application Data

(63) Continuation of application No. PCT/JP2018/027472, filed on Jul. 23, 2018.

(30) Foreign Application Priority Data

Aug. 14, 2017 (JP) .............................. JP2017-156508

(51) Int. Cl.

| | | |
|---|---|---|
| *G06F 3/047* | (2006.01) | |
| *G03C 1/047* | (2006.01) | |
| *H01B 5/14* | (2006.01) | |
| *H01B 13/00* | (2006.01) | |
| *G03F 7/16* | (2006.01) | |

(Continued)

(52) U.S. Cl.
CPC .............. *G06F 3/047* (2013.01); *G03C 1/047* (2013.01); *H01B 5/14* (2013.01); *H01B 13/00* (2013.01); *G03F 7/16* (2013.01); *G03F 7/20* (2013.01); *G03F 7/30* (2013.01); *G06F 2203/04112* (2013.01)

(58) Field of Classification Search
None
See application file for complete search history.

(56) References Cited

U.S. PATENT DOCUMENTS 10,303,311 B2    5/2019  Nakayama et al.
2017/0372816 A1  12/2017 Katagiri et al.

FOREIGN PATENT DOCUMENTS

| JP | 2007-188655 A | 7/2007 |
| JP | 2013-045246 A | 3/2013 |
| JP | 2014-241128 A | 12/2014 |

(Continued)

OTHER PUBLICATIONS

International Search Report Issued in PCT/JP2018/027472 dated Sep. 11, 2018.

(Continued)

*Primary Examiner* — Nicholas J Lee
(74) *Attorney, Agent, or Firm* — Edwards Neils LLC; Jean C. Edwards, Esq.

(57) ABSTRACT

A conductive film includes a support, detection electrodes that are arranged on at least one main surface of the support, connection portions that are arranged on the main surface so as to be electrically connected to an external terminal, and lead-out wirings that are arranged on the main surface, electrically connected to the detection electrodes through one end portion thereof, and electrically connected to the connection portions through the other end portion thereof, in which the connection portions contain a binder and a metal component, and a content of the metal component in the connection portions that is determined by X-ray photoelectron spectroscopy is 0.5 to 10 at %.

8 Claims, 1 Drawing Sheet

(51) Int. Cl.
    *G03F 7/20*    (2006.01)
    *G03F 7/30*    (2006.01)

(56)            References Cited

FOREIGN PATENT DOCUMENTS

JP      2017-107426 A     6/2017
WO      2015/174133 A1    11/2015
WO      2016/157585 A1    10/2016

OTHER PUBLICATIONS

Written Opinion Issued in PCT/JP2018/027472 dated Sep. 11, 2018.
International Preliminary Report on Patentability Issued in PCT/JP2018/027472 dated Feb. 18, 2020.

CONDUCTIVE FILM, TOUCH PANEL, AND METHOD FOR MANUFACTURING CONDUCTIVE FILM

CROSS-REFERENCE TO RELATED APPLICATIONS

This application is a Continuation of PCT International Application No. PCT/JP2018/027472 filed on Jul. 23, 2018, which was published under PCT Article 21(2) in Japanese, and which claims priority under 35 U.S.C § 119(a) to Japanese Patent Application No. 2017-156508 filed on Aug. 14, 2017. The above applications are hereby expressly incorporated by reference, in their entirety, into the present application.

BACKGROUND OF THE INVENTION

1. Field of the Invention

The present invention relates to a conductive film, a touch panel, and a method for manufacturing a conductive film.

2. Description of the Related Art

A conductive film constituted with a support and conductive thin wires formed thereon is widely used in electrodes of various electronic devices such as a solar cell, an inorganic electroluminescent (EL) element, and an organic EL element, electromagnetic wave shields for various display devices, touch panels, transparent planar heating elements, and the like. Particularly, in recent years, as smartphones and the like have become wide spread, a demand for a conductive film used as a touch panel sensor has rapidly increased.

As such a conductive film, WO2016/157585A describes "a conductive film having a support and conductive thin wires that are arranged on the support and contain a binder and a metal portion, in which in a case where the contour of the surface shape of a surface X of the conductive thin wires in a vertical cross section of the conductive thin wires is moved to the side of the support from the surface X of the conductive thin wires that is opposite to the side of the support, and a position where the contour reaches the metal portion contained in the conductive thin wires is regarded as an upper end position, an average area ratio VA of the metal portion in a region extending 100 nm toward the side of the support from the upper end position is equal to or higher than 1% and less than 50%, and in a case where the contour is moved to the side of the support from the upper end position, and a position where the conductive thin wires do not contain the metal portion in the conductive thin wires is regarded as a lower end position, an average area ratio VM1 of the metal portion in a region extending to 50 nm toward the side of the support from a position between the upper end position and the lower end position and a region extending 50 nm toward the side of the surface X from the position between the upper end position and the lower end position is equal to or higher than 50%".

Furthermore, JP2017-107426A describes "a base material with a conductive pattern comprising a base material, a conductive pattern which is provided on the base material and has a predetermined portion that will be an external connection terminal, and a cured resin film provided on the conductive pattern, in which 25% or more of the area of the predetermined portion overlaps the cured resin film".

SUMMARY OF THE INVENTION

The inventors of the present invention joined a connection portion of the conductive film described in WO2016/157585A to a terminal (corresponding to an external terminal) of a flexible printed wiring board through an Anisotropic Conductive Film (ACF) by means of compression bonding, thereby obtaining a laminate. Then, the inventors evaluated the adhesiveness of members in the laminate. As a result, the inventors have found that the adhesiveness needs to be further improved.

Furthermore, the inventors of the present invention stored the base material with a conductive pattern described in JP2017-107426A for a long period of time, and then compressing the base material and the terminal of the flexible printed wiring board together through ACF. As a result, the inventors have found that the electrical resistivity increases.

An object of the present invention is to provide a conductive film which exhibits excellent adhesiveness to a printed wiring board through ACF and has a low electrical resistivity even though the conductive film is connected to a printed wiring board through ACF after being stored for a long period of time.

Another object of the present invention is to provide a method for manufacturing a conductive film and a touch panel.

In order to achieve the above objects, the inventors of the present invention conducted intensive examinations. As a result, the inventors have found that the objects can be achieved by the following constitution.

[1] A conductive film comprising a support, detection electrodes that are arranged on at least one main surface of the support, connection portions that are arranged on the main surface so as to be electrically connected to an external terminal, and lead-out wirings that are arranged on the main surface, electrically connected to the detection electrodes through one end portion thereof, and electrically connected to the connection portions through the other end portion thereof, in which the connection portions contain a binder and a metal component, and a content of the metal component in the connection portions that is determined by X-ray photoelectron spectroscopy is 0.5 to 10 at %.

[2] The conductive film described in [1], in which at least one kind of member selected from the group consisting of the lead-out wirings and the detection electrodes further contains the binder and the metal component.

[3] The conductive film described in [1] or [2], in which the detection electrodes are formed of mesh-like conductive thin wires containing the binder and the metal component.

[4] The conductive film described in any one of [1] to [3], in which the metal component contains at least one kind of atom selected from the group consisting of gold, silver, copper, nickel, palladium, tungsten, molybdenum, and chromium.

[5] The conductive film described in any one of [1] to [4], in which an area ratio of the metal component in a cross section of the connection portions ranging from a surface of the connection portions to a position 5 nm below the surface in a thickness direction is 0.5% to 8%.

[6] A touch panel having the conductive film described in any one of [1] to [5].

[7] A method for manufacturing the conductive film described in any one of [1] to [5] in which the binder contains a polymer and the metal component contains metal silver, the method including a step of forming a silver halide-containing photosensitive layer by coating a support with a silver halide-containing coating solution, which contains silver halide, gelatin, and a polymer different from the gelatin, and a compositionally prepared coating solution, which contains a polymer different from the gelatin, by simultaneous multilayer coating, a step of forming metal silver-containing connection portions by exposing the silver halide-containing photosensitive layer and then performing a development treatment on the photosensitive layer, and a step of obtaining the conductive film by removing the gelatin from the connection portions.

According to the present invention, it is possible to provide a conductive film which exhibits excellent adhesiveness (hereinafter, described as "ACF adhesion reliability" as well) to a flexible printed wiring board through ACF and has a low electrical resistivity (hereinafter, described as "environmental durability" as well) even though the conductive film is connected to a printed wiring board through ACF after being stored for a long period of time.

Furthermore, the present invention can provide a method for manufacturing a conductive film and a touch panel.

DESCRIPTION OF THE PREFERRED EMBODIMENTS

Figure 1:
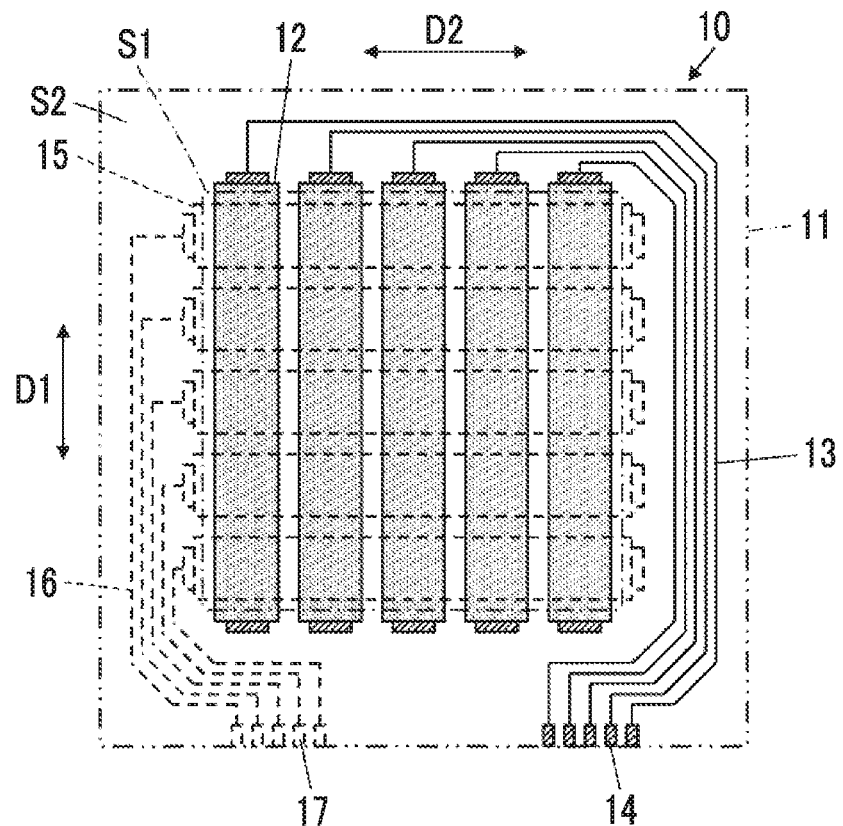
FIG. 1 is a schematic plan view of a conductive film according to an embodiment of the present invention.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit.

[Conductive Film]

The conductive film according to an embodiment of the present invention is a conductive film comprising a support, detection electrodes that are arranged on one main surface of the support, connection portions that are arranged on the main surface so as to be electrically connected to an external terminal, and lead-out wirings that are arranged on the main surface, electrically connected to the detection electrodes through one end portion thereof, and electrically connected to the connection portions through the other end portion thereof, in which the connection portions contain a binder and a metal component, and a content of the metal component in the connection portions that is determined by X-ray photoelectron spectroscopy is 0.5 to 10 at %.

One of the characteristics of the conductive film according to the above embodiment is that the content of the metal component in the connection portions that is determined by X-ray photoelectron spectroscopy is 0.5 to 10 at %.

The inventors of the present invention stored a laminate, which was obtained by joining the connection portions of the conductive film to an external terminal through ACF by means of compression bonding, under the condition of a constant humidity and a constant temperature. As a result, the inventors have found that in a case where the content of the metal component in the connection portions is equal to or greater than 0.5 at %, a conductive film is obtained which hardly increases electrical resistivity even after storage and has excellent ACF adhesion reliability.

The inventors consider that in a case where the content of the metal component in the connection portions is equal to or greater than 0.5 at %, peeling may hardly occur between the connection portions and ACF during storage, and accordingly, the aforementioned conductive film may be obtained.

Meanwhile, the inventors have found that in a case where the content of the metal component in the connection portions is equal to or smaller than 10 at %, even though the conductive film is stored under the condition of a constant humidity and a constant temperature and then compressed together with terminals of a flexible printed wiring board through ACF, a conductive film is obtained which has a sufficiently low electrical resistivity and excellent environmental durability.

The inventors of the present invention assume that, for example, in the base material with a conductive pattern described in JP2017-107426A, the portion of the exposed conductive pattern may be corroded during storage, the electrical resistivity of the external terminals and the connection portions may increase, and accordingly, the aforementioned conductive film may be obtained.

The content of the metal component is preferably equal to or smaller than 9.5 at %, and more preferably equal to or smaller than 8.0 at %.

In the present specification, the content of the metal component determined by X-ray photoelectron spectroscopy means a metal exposure rate (at %) that is measured by the method described in Examples. The metal exposure rate determined by the above method is a value reflecting the content (at %) of the metal component in a region extending 10 nm in a thickness direction from a surface of the conductive film.

Hereinafter, the conductive film according to the embodiment of the present invention will be described using drawings.

FIG. 1 is a schematic plan view of the conductive film according to the embodiment of the present invention. In a conductive film 10, a support 11 is divided into a touch region S1 and a peripheral region S2 that is on the outside of the touch region S1. In the touch region S1 on one main surface of the support 11, a plurality of first detection electrodes 12 extending in a D1 direction are arranged in a row along a D2 direction orthogonal to the D1 direction. Furthermore, in the peripheral region S2, a plurality of first lead-out wirings 13 electrically connected to the plurality of first detection electrodes 12 are arranged at positions close to each other. In addition, in the peripheral region S2, first connection portions 14, which are electrically connected to the plurality of first lead-out wirings 13 and will be connected to an external terminal (typically, a flexible printed wiring board), are arranged at position close to each other. That is, the first lead-out wirings 13 are electrically connected to the first detection electrodes through one end portion thereof and electrically connected to the first connection portions 14 through the other end portion thereof.

Likewise, in the touch region S1 on the other main surface of the support 11, a plurality of second detection electrodes 15 extending in the second direction D2 are arranged in a row along the D1 direction. Furthermore, in the peripheral region S2, a plurality of second lead-out wirings 16 electrically connected to the plurality of second detection electrodes 15 are arranged at positions close to each other. In addition, in the peripheral region S2, second connection portions 17, which are electrically connected to the plurality of second lead-out wirings 16 and will be connected to an external terminal, are arranged at positions close to each other.

In the present specification, among surfaces of a support, a surface having area larger than that of other surfaces is called main surface. For example, a plate-like support has two main surfaces including a front surface and a back surface that face each other.

In the conductive film shown in FIG. 1, detection electrodes, lead-out wirings, and connection portions are arranged on each of the main surfaces of the support, but the conductive film according to the embodiment of the present invention is not limited thereto. That is, the conductive film may have detection electrodes, lead-out wirings, and connection portions on at least one main surface thereof.

It is preferable that the detection electrodes, the lead-out wirings, and the connection portions (hereinafter, these members will be collectively referred to as "conductive portion" in some cases) according to the present embodiment contain silver and a binder.

In a case where the connection portions according to the present embodiment contain silver and a binder, it is easy to adjust the metal exposure rate to be within a predetermined range. Furthermore, in a case where the lead-out wirings and the detection electrodes contain silver and a binder, the lead-out wirings and the detection electrodes can be more easily manufactured by the manufacturing method which will be described later.

In the conductive film according to the embodiment of the present invention, as the material of the conductive portion, the materials of the conductive portion are not limited to the above materials, and known conductive materials containing a metal component can be used. Examples of the metal component include gold, silver, platinum, copper, nickel, palladium, tungsten, molybdenum, chromium, an alloy of these, and the like. Examples of the conductive material also include indium oxide (including tin oxide-doped indium oxide and/or zinc oxide-doped indium oxide), zinc oxide, tin oxide, titanium oxide, and the like.

Particularly, it is preferable that the material of the conductive portion contains a metal component and a binder. As the metal component, at least one kind of metal selected from the group consisting of gold (metal gold), silver (metal silver), copper (metal copper), nickel (metal nickel), palladium (metal palladium), and chromium is preferable, and at least one kind of metal selected from the group consisting of gold, silver, copper, nickel, and palladium is more preferable because these have better conduction characteristics, and silver (metal silver) is particularly preferable.

The binder is not particularly limited, but it is preferable that the binder contains a polymer. The type of the polymer is not particularly limited, and examples thereof include known polymers. Particularly, a polymer different from gelatin is preferable. The polymer different from gelatin will be described later.

(Detection Electrodes)

Figure 2:
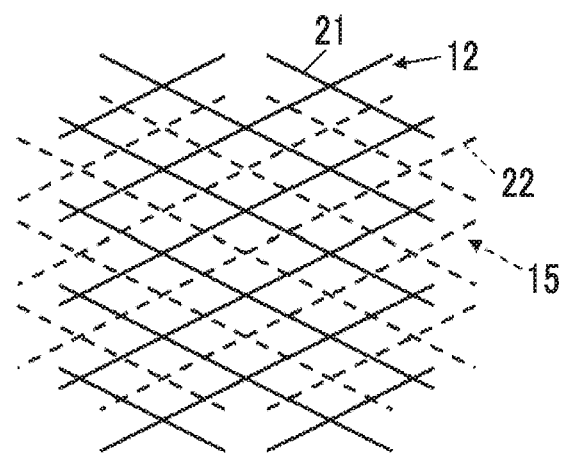
FIG. 2 is a partially enlarged view of first detection electrodes arranged on a main surface of a support.

FIG. 2 is a partially enlarged view of the first detection electrodes 12 arranged on the main surface of the support 11.

The first detection electrodes are formed of a mesh pattern constituted with first conductive thin wires 21 containing metal silver and a binder. The second detection electrodes 15, which are arranged on the other main surface of the support 11 and contain metal silver and a binder, are also formed of a mesh pattern constituted with second conductive thin wires 22. In a case where a touch panel is formed using the conductive film described above, and a user sees the touch region (hereinafter, described as "at the time of watching" as well), the first conductive thin wires 21 and the second conductive thin wires 22 are arranged to cross each other.

In the conductive film according to the embodiment of the present invention, the shape of the first conductive thin wires and the second conductive thin wires is not particularly limited. That is, the pattern formed of the plurality of conductive thin wires is preferably in the form of a triangle such as a regular triangle, an isosceles triangle, or a right triangle; a quadrangle such as a square, a rectangle, a diamond, a parallelogram, or a trapezoid; a (regular) polygon with n straight sides such as a (regular) hexagon or a (regular) octagon; a circle; an ellipse; a pentagram; or a geometric figure obtained by combining these. Particularly, the pattern is even more preferably in the form of a mesh having the shape of the geometric figure obtained by combining these. The form of a mesh means a shape having a plurality of square lattices constituted with conductive thin wires crossing each other.

Specifically, regarding conductive thin wires other than the above, for example, first detection electrodes are formed of a plurality of first conductive thin wires that have repeated curves and are parallel to each other, second detection electrodes are formed of a plurality of second conductive thin wires that have repeated curves and are parallel to each other, and the plurality of first conductive thin wires and the plurality of second conductive thin wires form a large number of polygonal meshes by being stacked on each other at the time of watching.

The length Pa of one side of the lattices formed of the first conductive thin wires and the second conductive thin wires according to the present embodiment is not particularly limited. However, Pa is preferably 50 to 500 µm, and more preferably 150 to 300 µm. In a case where the length of one side of a unit lattice is within the above range, it is more difficult for the conductive thin wires to be visible to a touch panel user.

In view of visible light transmittance, the opening ratio of the conductive portion formed of the conductive thin wires is preferably equal to or higher than 85%, more preferably equal to or higher than 90%, and most preferably equal to or higher than 95%. The opening ratio is equivalent to the proportion of a region on the support except for a region occupied by the conductive thin wires in the entire region of the support.

The line width of the conductive thin wires is not particularly limited, but is preferably equal to or smaller than 30 µm, more preferably equal to or smaller than 15 µm, even more preferably equal to or smaller than 10 µm, particularly preferably equal to or smaller than 9 µm, and most preferably equal to or smaller than 7 µm. Furthermore, the line width is preferably equal to or greater than 0.5 µm, and more preferably equal to or greater than 1.0 µm. In a case where the line width is within the above range, it is possible to relatively easily form a low resistance electrode.

The thickness of the conductive thin wires is not particularly limited, but is preferably equal to or greater than 0.01 µm, and more preferably equal to or greater than 0.05 µm. Furthermore, the thickness of the conductive thin wires is preferably equal to or smaller than 20 µm, more preferably equal to or smaller than 5 µm, even more preferably equal to or smaller than 3 µm, particularly preferably equal to or smaller than 2 µm, and most preferably equal to or smaller than 1.5 µm. In a case where the thickness of the conductive thin wires is within the above range, it is possible to relatively easily form a low resistance electrode which hardly allows the metal thin wires to be seen and has excellent durability.

(Lead-Out Wirings)

In the conductive film according to the present embodiment, the lead-out wirings are preferably formed of conductive thin wires containing silver and a binder.

The lead-out wirings are arranged in the peripheral region S2. In a touch panel having the conductive film described above, the lead-out wirings are not visible to a user. Therefore, the width of the conductive thin wires forming the lead-out wirings does not depend on whether or not the conductive thin wires will be visually recognized, and can be appropriately set such that sufficient conduction occurs. Particularly, in view of obtaining a conductive film having further improved effects of the present invention, the line width of the conductive thin wires is preferably equal to or smaller than 500 µm more preferably equal to or smaller than 50 µm, and particularly preferably equal to or smaller than 30 µm.

In the conductive film according to the present embodiment, each of the lead-out wirings is formed of one conductive thin wires having a predetermined line width. However, the conductive film according to the embodiment of the present invention is not limited thereto. Just as the detection electrodes described above, each of the lead-out wirings may be in the form of a mesh formed of conductive thin wires.

(Connection Portions)

In the conductive film according to the present embodiment, each of the connection portions is in the form of a line having a width larger than that of each of the lead-out wirings. The connection portions are also arranged in the peripheral region S2 just as the lead-out wirings. Therefore, the shape of the connection portions and the like can be appropriately set according to the shape of an external terminal and the like.

In the conductive film according to the present embodiment, each of the connection portions is in the form of a line and has the shape of a film having a predetermined width and length. However, the connection portions are not limited thereto, and may be in the form of a mesh formed of a plurality of conductive thin wires just as the detection electrodes.

The way the metal component is distributed in the connection portions is not particularly limited. Particularly, in view of obtaining a conductive film having further improved effects of the present invention, in a case where a cross section of the connection portions is observed using a scanning electron microscope, the area ratio of the metal component (hereinafter, referred to as "metal area ratio" as well) in a region ranging from the surface of the connection portions to a position 5 nm below the surface in a thickness direction (in other words, a region between the surface and a position 5 nm below the surface in a thickness direction, hereinafter, referred to as "surface layer region" as well) is preferably equal to or higher than 0.1%, and more preferably equal to or higher than 0.5%. Furthermore, the metal area ratio is preferably equal to or lower than 20%, and more preferably equal to or lower than 8%.

In a case where the area ratio of the metal component is 0.5% to 8%, the conductive film has further improved environmental durability and further improved ACF adhesion reliability.

The method for measuring the metal area ratio in the surface layer region is as described in Examples.

<Support>

The type of the support is not particularly limited, as long as the support is capable of supporting the conductive portion. As the support, a transparent support is preferable, and a plastic film is more preferable. In a case where a transparent support is used, the conductive film can be preferably used as a transparent conductive film.

Specifically, as the material constituting the support, for example, a plastic film having a melting point that is about equal to or lower than 290° C., such as polyethylene terephthalate (PET, 258° C.), polycycloolefin (134° C.), polycarbonate (250° C.), polyethylene naphthalate (PEN, 269° C.), polyethylene (PE, 135° C.), polypropylene (PP, 163° C.), polystyrene (230° C.), polyvinyl chloride (180° C.), polyvinylidene chloride (212° C.), or triacetyl cellulose (TAC, 290° C.), is preferable, and PET, polycycloolefin, or polycarbonate is more preferable. The number in the parenthesis is a melting point. The total light transmittance of the support is preferably 85% to 100%.

In addition, for example, a glass plate such as synthetic quartz glass, soda lime-based glass, aluminosilicate glass, or chemically strengthened glass can also be used as a support. In view of obtaining a conductive film having excellent impact resistance and excellent scratch resistance, chemically strengthened glass is preferable.

The thickness of the support is not particularly limited and may be appropriately set according to use. For example, for touch panels, the thickness of the support is preferably 25 to 500 µm in general.

For example, one of the suitable aspects of the support includes a treated support having undergone at least one treatment selected from the group consisting of an atmospheric pressure plasma treatment, a corona discharge treatment, and an ultraviolet irradiation treatment. In a case where the above treatment is performed on the support, hydrophilic groups such as OH groups are introduced into the surface of the treated support, and the adhesiveness of the conductive portion that will be described later is further improved.

Among the above treatments, in view of further improving the adhesiveness of the conductive portion, an atmospheric pressure plasma treatment is preferable.

As another suitable aspect of the support, a support with an undercoat layer having an undercoat layer, which contains a polymer different from gelatin that will be described later, on a surface thereof is preferable. The conductive portion formed on the support with an undercoat layer exhibits further improved adhesiveness to the undercoat layer.

The method for forming the undercoat layer is not particularly limited. Examples thereof include a method of coating a support with a composition for forming an undercoat layer containing a polymer different from gelatin and performing a heating treatment on the support if necessary. If necessary, the composition for forming an undercoat layer may contain a solvent. The type of the solvent is not particularly limited, and examples thereof include solvents used in a composition for forming a photosensitive layer which will be described later. Furthermore, as the composition for forming an undercoat layer containing a polymer different from gelatin, latex containing fine particles of a polymer different from gelatin may be used.

The thickness of the undercoat layer is not particularly limited. In view of further improving the adhesiveness of the conductive portion, the thickness of the undercoat layer is preferably 0.02 to 0.3 µm, and more preferably 0.03 to 0.2 m.

[Method for Manufacturing Conductive Film]

The method for manufacturing a conductive film is not particularly limited. Particularly, in a case where the conductive film contains silver (metal silver) as a metal component, in view of improving productivity, a manufacturing method including the following steps is preferable.

First Step:

A step of forming a silver halide-containing photosensitive layer by coating a support with a silver halide-containing coating solution, which contains silver halide and a polymer different from gelatin, and a compositionally prepared coating solution, which contains a polymer different from gelatin, by simultaneous multilayer coating.

Second Step:

A step of forming a metal silver-containing conductive portion by exposing the silver halide-containing photosensitive layer and then performing a development treatment on the photosensitive layer.

Third Step:

A step of obtaining a conductive film by removing gelatin from the conductive portion.

In a case where the conductive film contains silver, a first embodiment of the conductive film is as below.

A conductive film comprising a support, detection electrodes that are arranged on at least one main surface of the support, connection portions that are arranged on the main surface so as to be electrically connected to an external terminal, and lead-out wirings that are arranged on the main surface, electrically connected to the detection electrodes through one end portion thereof, and electrically connected to the connection portions through the other end portion thereof, in which the detection portions, the lead-out wirings, and the connection portions contain a binder and silver, and a content of the metal component in the connection portions that is determined by X-ray photoelectron spectroscopy is 0.5 to 10 at %.

<First step>

The first step is a step of forming a silver halide-containing photosensitive layer by coating a support with a silver halide-containing coating solution, which contains silver halide and a polymer different from gelatin, and a compositionally prepared coating solution, which contains a polymer different from gelatin, by simultaneous multilayer coating.

In order to manufacture the conductive film according to the first embodiment described above, it is preferable to perform simultaneous multilayer coating such that the silver halide-containing coating solution and the compositionally prepared coating solution are laminated in this order from the side of the support. In the present specification, "coating a support" includes a case where the surface of a support is directly coated, and a case where another layer is disposed on a support and the layer is coated.

Hereinafter, first, materials used in this step will be specifically described.

(Silver Halide)

The halogen atom contained in the silver halide may be any of a chlorine atom, a bromine atom, an iodine atom, and a fluorine atom, or may be a combination of these. For example, silver halide mainly constituted with silver chloride, silver bromide, or silver iodide is preferable, and silver halide mainly constituted with silver bromide or silver chloride is more preferable. As the silver halide, silver chlorobromide, silver iodochlorobromide, or silver iodobromide is also preferable. Among these, silver chlorobromide, silver bromide, silver iodochlorobromide, or silver iodobromide is more preferable, and silver chlorobromide or silver iodochlorobromide with a silver chloride content equal to or greater than 50 mol % is particularly preferable.

"Silver halide mainly constituted with silver bromide" refers to silver halide in which a molar fraction of bromide ions in the silver halide composition is equal to or higher than 50%. The silver halide particles mainly constituted with silver bromide may contain iodide ions or chloride ions in addition to the bromide ions.

The silver halide is in the form of solid particles. The average particle size of the silver halide expressed as an equivalent spherical diameter is preferably 0.1 to 1,000 nm (1 μm), more preferably 0.1 to 300 nm, and even more preferably 1 to 200 nm.

The equivalent spherical diameter of the silver halide is a diameter of particles which are in the form of spheres and have the same volume as the silver halide particles.

The shape of the silver halide particles is not particularly limited. Examples of the shape include a sphere, a cube, a flat plate (a hexagonal flat plate, a triangular flat plate, a quadrangular flat plate, or the like), an octahedron, a tetradecahderon, and the like.

Furthermore, regarding the use of metal compounds of group VIII or group VIIB such as a rhodium compound and an iridium compound and palladium compounds used for stabilizing the silver halide and/or increasing the sensitivity of the silver halide, the description in paragraphs "0039" to "0042" in JP2009-188360A can be referred to. In addition, regarding chemical sensitizing, the technique described in paragraph "0043" in JP2009-188360A can be referred to.

(Gelatin)

The type of the gelatin is not particularly limited. For example, in addition to lime-treated gelatin, acid-treated gelatin may be used. Furthermore, a hydrolysate of gelatin, an enzymatically decomposed product of gelatin, and gelatin modified with an amino group, a carboxyl group, or the like (for example, phthalated gelatin, acetylated gelatin, or the like) may also be used.

(Polymer Different from Gelatin (Hereinafter, Simply Referred to as "Polymer" as Well))

The type of the polymer to be used is not particularly limited as long as the polymer is different from gelatin. As the polymer, a polymer that is not decomposed by an oxidant decomposing gelatin that will be described later is preferable. The polymer contained in the silver halide-containing coating solution and the polymer contained in the compositionally prepared coating solution may be the polymers of the same type or different types.

Examples of the polymer include a hydrophobic polymer (hydrophobic resin) and the like. More specifically, examples of the polymer include at least one kind of resin selected from the group consisting of an acrylic resin, a styrene-based resin, a vinyl-based resin, a polyolefin-based resin, a polyester-based resin, a polyurethane-based resin, a polyamide-based resin, a polycarbonate-based resin, a polydiene-based resin, an epoxy-based resin, a silicone-based resin, a cellulose-based polymer, and a chitosan-based polymer, a copolymer containing a monomer constituting the above resins, and the like.

It is preferable that the polymer has a reactive group reacting with a crosslinking agent which will be described later.

Furthermore, as another suitable aspect of the polymer, a polymer (copolymer) represented by the following General Formula (1) is preferable because this polymer can further prevent the permeation of moisture.

General Formula (1): -(A)x-(B)y-(C)z-(D)w-

In General Formula (1), A, B, C, and D each represent the following repeating unit.

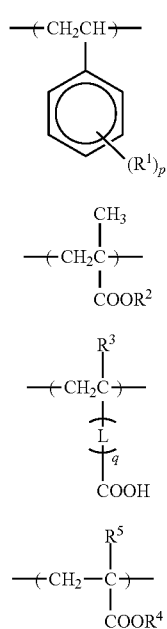

R¹ represents a methyl group or a halogen atom, and is preferably a methyl group, a chlorine atom, or a bromine atom. p represents an integer of 0 to 2. p is preferably 0 or 1, and more preferably 0.

$R^2$ represents a methyl group or an ethyl group, and is preferably a methyl group.

$R^3$ represents a hydrogen atom or a methyl group, and is preferably a hydrogen atom. L represents a divalent linking group, and is preferably a group represented by General Formula (2).

General Formula (2): —(CO—X¹)r-X²—

In General Formula (2), $X^1$ represents an oxygen atom or —NR³⁰—. $R^{30}$ represents a hydrogen atom, an alkyl group, an aryl group, or an acyl group, and may have a substituent (for example, a halogen atom, a nitro group, a hydroxyl group, or the like). $R^{30}$ is preferably a hydrogen atom, an alkyl group having 1 to 10 carbon atoms (for example, a methyl group, an ethyl group, a n-butyl group, a n-octyl group, or the like), or an acyl group (for example, an acetyl group, a benzoyl group, or the like). $X^1$ is preferably an oxygen atom or —NH—.

$X^2$ represents an alkylene group, an arylene group, an alkylene arylene group, an arylene alkylene group, or an alkylene arylene alkylene group. —O—, —S—, —OCO—, —CO—, —COO—, —NH—, —SO₂—, —N(R³¹)—, —N(R³¹)SO₂—, or the like may be inserted into the above groups. $R^{31}$ represents a linear or branched alkyl group having 1 to 6 carbon atoms, such as a methyl group, an ethyl group, an isopropyl group, or the like. As $X^2$, a dimethylene group, a trimethylene group, a tetramethylene group, an o-phenylene group, a m-phenylene group, a p-phenylene group, —CH₂CH₂OCOCH₂CH₂—, —CH₂CH₂OCO (C₆H₄)—, and the like are preferable.

r represents 0 or 1.

q represents 0 or 1, and is preferably 0.

$R^4$ represents an alkyl group having 5 to 80 carbon atoms, an alkenyl group, or an alkynyl group. $R^4$ is preferably an alkyl group having 5 to 50 carbon atoms, more preferably an alkyl group having 5 to 30 carbon atoms, and even more preferably an alkyl group having 5 to 20 carbon atoms.

$R^5$ represents a hydrogen atom, methyl group, an ethyl group, a halogen atom, or —CH₂COOR⁶. $R^5$ is preferably a hydrogen atom, a methyl group, a halogen atom, or —CH₂COOR⁶, more preferably a hydrogen atom, a methyl group, or —CH₂COOR⁶, and particularly preferably a hydrogen atom.

$R^6$ represents a hydrogen atom or an alkyl group having 1 to 80 carbon atoms, and may be the same as or different from $R^4$. The number of carbon atoms in $R^6$ is preferably 1 to 70, and more preferably 1 to 60.

In General Formula (1), x, y, z, and w each represent a molar ratio of each repeating unit.

x is preferably 3 to 60 mol %, more preferably 3 to 50 mol %, and even more preferably 3 to 40 mol %.

y is preferably 30 to 96 mol %, more preferably 35 to 95 mol %, and even more preferably 40 to 90 mol %.

z is preferably 0.5 to 25 mol %, more preferably 0.5 to 20 mol %, and even more preferably 1 to 20 mol %.

w is preferably 0.5 to 40 mol %, and more preferably 0.5 to 30 mol %.

In General Formula (1), x is particularly preferably 3 to 40 mol %, y is particularly preferably 40 to 90 mol %, z is particularly preferably 0.5 to 20 mol %, and w is particularly preferably 0.5 to 10 mol %.

As the polymer represented by General Formula (1), a polymer represented by the following General Formula (2) or the following General Formula (3) is preferable.

General Formula (2)

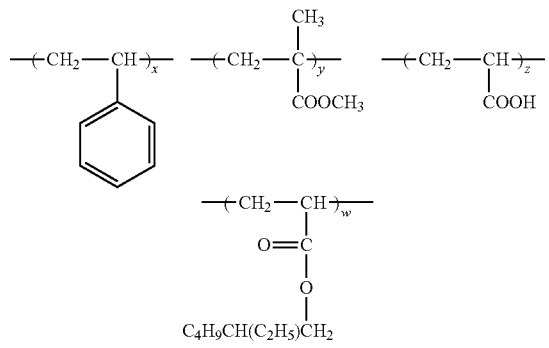

In General Formula (2), x, y, z, and w have the same definition as x, y, z, and w described above.

General Formula (3)

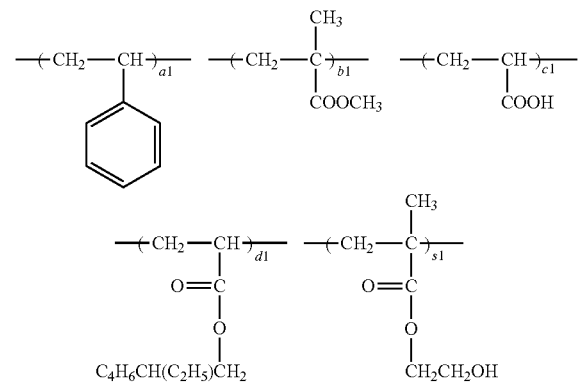

In the above formula, a1, b1, c1, d1, and e1 each represent a molar ratio of each monomer unit. a1 represents 3 to 60 (mol %), b1 represents 30 to 95 (mol %), c1 represents 0.5 to 25 (mol %), d1 represents 0.5 to 40 (mol %), and e1 represents 1 to 10 (mol %).

The preferable range of a1 is the same as the preferable range of x described above. The preferable range of b1 is the same as the preferable range of y described above. The preferable range of c1 is the same as the preferable range of z described above. The preferable range of d1 is the same as the preferable range of w described above.

e1 is preferably 1 to 10 mol %, more preferably 2 to 9 mol %, and even more preferably 2 to 8 mol %.

The weight-average molecular weight of the polymer represented by General Formula (1) is preferably 1,000 to 1,000,000, more preferably 2,000 to 750,000, and even more preferably 3,000 to 500,000.

The polymer represented by General Formula (1) can be synthesized, for example, with reference to Japanese Patent No. 3305459, Japanese Patent No. 3754745, and the like.

(Solvent)

The silver halide-containing coating solution and the compositionally prepared coating solution contain a solvent.

Examples of the solvent to be used include water, organic solvents (for example, alcohols such as methanol; ketones such as acetone; amides such as formamide; sulfoxides such as dimethyl sulfoxide; esters such as ethyl acetate; ethers; and the like), ionic liquids, and a mixed solvent of these.

(Others)

If necessary, the silver halide-containing coating solution and the compositionally prepared coating solution may contain other materials in addition to the materials described above. For example, it is preferable that the coating solutions contain a crosslinking agent used for crosslinking the polymers described above. In a case where the coating solutions contain a crosslinking agent, the polymers are crosslinked. Therefore, even in a case where gelatin is decomposed and removed in the steps which will be described later, metal silver atoms in the conductive thin wires remain linked to each other, and consequently, the conductive film has further improved conduction characteristics.

(Procedure)

As the method for performing simultaneous multilayer coating by using the silver halide-containing coating solution and the compositionally prepared coating solution, known methods can be adopted without particular limitation. For example, a die coating method is preferable. The die coating method includes a slide coating method, an extrusion coating method, and a curtain coating method. Among these, a slide coating method or extrusion coating is preferable, and extrusion coating is more preferable because this method is highly suitable for forming a thin layer by coating.

After the simultaneous multilayer coating is performed, if necessary, a drying treatment may be performed on the obtained coating film. In a case where the drying treatment is performed, it is easy to remove the solvent contained in the coating film obtained using the silver halide-containing coating solution and the coating film obtained using the compositionally prepared coating solution.

In the coating film formed of the compositionally prepared coating solution, the mass ratio of the content ($g/m^2$) of the polymer to the content ($g/m^2$) of the gelatin is preferably higher than 0.1, more preferably equal to or higher than 0.2 and even more preferably equal to or higher than 0.3. The upper limit thereof is preferably less than 2.0, more preferably equal to or lower than 1.8, even more preferably equal to or lower than 1.5, and particularly preferably equal to or lower than 1.0.

In a case where the mass ratio of the content of the polymer to the content of the gelatin is higher than 0.1, the metal exposure rate easily becomes equal to or higher than 10 at %. Furthermore, in a case where the mass ratio of the content of the polymer to the content of the gelatin is less than 2.0, the metal exposure rate easily becomes equal to or higher than 0.5 at %.

The content of the polymer in the coating film formed of the compositionally prepared coating solution is not particularly limited, but is preferably greater than 0.01 $g/m^2$, more preferably greater than 0.03 $g/m^2$, even more preferably equal to or greater than 0.1 $g/m^2$, and still more preferably less than 0.3 $g/m^2$.

In the coating film formed of the silver halide-containing coating solution, the mass ratio of the content ($g/m^2$) of the polymer to the content ($g/m^2$) of the gelatin is preferably equal to or higher than 0.1, and more preferably equal to or higher than 0.2. Furthermore, the mass ratio is preferably equal to or lower than 2.0, more preferably equal to or lower than 1.0, and even more preferably less than 0.5.

In a case where the mass ratio of the content of the polymer to the content of the gelatin is less than 0.5, the metal exposure rate easily becomes equal to or higher than 0.5 at %.

In the coating film formed of the silver halide-containing coating solution, the content of the polymer is preferably equal to or greater than 0.04 $g/m^2$, more preferably equal to or greater than 0.08 $g/m^2$, even more preferably equal to or greater than 0.1 $g/m^2$, and most preferably greater than 0.12 $g/m^2$. Furthermore, the content of the polymer is preferably equal to or smaller than 2.0 $g/m^2$, and more preferably equal to or smaller than 0.4 $g/m^2$.

In a case where the content of the polymer in the coating film formed of the silver halide-containing coating solution is greater than 0.1 $g/m^2$, the metal exposure rate easily becomes equal to or lower than 10 at %.

The content of the silver halide in the coating film formed of the silver halide-containing coating solution is not particularly limited. In view of further improving the conduction characteristics of the conductive thin wires, the content of the silver halide expressed in terms of silver is preferably 3.0 to 20.0 $g/m^2$, and more preferably 5.0 to 15.0 $g/m^2$.

<Second Step>

The second step is a step of forming a conductive portion containing metal silver by exposing the silver halide-containing photosensitive layer and then developing the photosensitive layer. By performing this step, the silver halide is reduced, and a conductive portion containing metal silver is formed. Generally, exposure is pattern-wise performed, and the conductive portion containing metal silver is formed in the exposed portion. In contrast, in an unexposed portion, the silver halide is eluted due to the development treatment, which will be described later, and accordingly, a non-conductive portion containing the gelatin and the polymer described above is formed. The non-conductive portion substantially does not contain metal silver. The non-conductive portion means a region that does not exhibit conductivity. Hereinafter, the exposure treatment and the development treatment performed in this step will be specifically described.

In a case where the silver halide-containing photosensitive layer is pattern-wise exposed, in the exposed portion, the silver halide in the silver halide-containing photosensitive layer forms a latent image. The exposed portion is developed and forms a conductive portion. In contrast, in an unexposed portion, the silver halide is eluted at the time of development, and consequently, the unexposed portion becomes a transparent film (non-conductive portion).

As the light source for exposure, light rays such as visible rays and ultraviolet or radiation such as X-rays can be used without particular limitation.

The method of the pattern exposure is not particularly limited, and may be surface exposure through a photomask or scanning exposure using laser beams. The shape of the pattern is not particularly limited, and is appropriately prepared according to the conductive thin wires desired to be formed.

The development method is not particularly limited. For example, it is possible to use known methods used for a silver salt photographic film, photographic paper, a film for making a printing plate, an emulsion mask for a photomask, and the like.

As a developer, for example, a phenidone hydroquinone (PQ) developer, a Metol hydroquinone (MQ) developer, a metol-ascorbic acid (MAA) developer, and the like can be used without particular limitation.

For the purpose of stabilization by the removal of the silver salt in the unexposed portion, the present step may further include a fixing step. The fixing step is performed simultaneously with the development and/or after the development. As the fixing method, it is possible to use methods used for a silver salt photographic film, photographic paper, a film for making a printing plate, an emulsion mask for a photomask, and the like.

The fixing temperature is preferably 20° C. to 50° C., and more preferably 25° C. to 45° C. The fixing time is preferably 5 seconds to 1 minute, and more preferably 7 seconds to 50 seconds.

The silver halide-containing photosensitive layer having undergone the development and fixing step may be further rinsed and/or stabilized.

<Third Step>

The third step is a step of obtaining a conductive film by removing the gelatin from the conductive portion obtained by the second step. Through this step, the gelatin in the silver halide-containing photosensitive layer (the exposed portion and the unexposed portion) having undergone exposure and development is decomposed and removed, and a conductive film is formed. Particularly, the gelatin is removed from the conductive portion, and hence the density of the metal silver is further increased. Here, in a case where sufficient conductivity is obtained even though the third step is not performed, the third step can be skipped as appropriate.

The procedure of this step is not particularly limited as long as the gelatin can be removed. Examples thereof include a method of decomposing and removing the gelatin by using a protease and a method of decomposing and removing the gelatin by using a predetermined oxidant.

As the method for decomposing and removing the gelatin by using a protease, for example, it is possible to adopt the methods described in paragraphs "0084" to "0087" in JP2014-209332A.

As the method for decomposing and removing the gelatin by using an oxidant, for example, it is possible to adopt the methods described in paragraphs "0064" to "0066" in JP2014-1125124.

<Modification example>

Examples of modification examples include an aspect in which in the first step described above, the simultaneous multilayer coating is performed such that another compositionally prepared coating solution, the silver halide-containing coating solution, and the compositionally prepared coating solution are laminated in this order from the side of the support.

If necessary, a predetermined additive (for example, a colorant) may be added to the aforementioned another compositionally prepared coating solution. Furthermore, if necessary, another functional layer may be provided by the simultaneous multilayer coating or separately provided by coating.

In the coating film formed of the aforementioned another compositionally prepared coating solution, the mass ratio of the content of the gelatin to the total solid contents (content of gelatin/total solid contents) is preferably equal to or higher than 0.05, more preferably equal to or higher than 0.1, and even more preferably higher than 0.2. Furthermore, the mass ratio is preferably equal to or lower than 0.6, and more preferably equal to or lower than 0.5.

In a case where the mass ratio is equal to or higher than 0.05, because the coating film contains an appropriate amount of gelatin, the gelatin can be easily removed by the third step. Consequently, a conductive film having a low electrical resistivity and/or inhibiting electrochemical migration is obtained.

The content of the polymer in the coating film formed of the aforementioned another compositionally prepared coating solution is not particularly limited, but is preferably 0.03 to 0.3 g/m$^2$, and more preferably 0.05 to 0.10 g/m$^2$.

Other examples of modification examples include an aspect in which nonmetallic fine particles are used instead of or in addition to the polymer in the compositionally prepared coating solution.

If necessary, other steps may be performed in addition to the first step to the third step described above.

For example, in order to improve the conduction characteristics of the conductive thin wires, a smoothing step of performing a calender treatment described in paragraphs "0098" to "0100" in JP2014-209332A may be carried out after the third step.

In addition, a calender step of performing a calender treatment for transferring surface asperities to conductive thin wires described in paragraphs "0165" to "0183" in JP2015-005495A may be carried out after the third step. In this case, by providing asperities on the surface, the effect of making it more difficult for the conductive thin wires to be visually recognized is synergistically exerted. Therefore, it is preferable to perform the calender step.

Furthermore, in order to improve the conduction characteristics of the conductive thin wires, a heating step of performing the heating treatment described in paragraphs "0101" to "0103" in JP2014-209332A may be carried out after the third step.

In view of further improving the effects of the present invention, it is preferable to perform a smoothing step of smoothing the conductive thin wires (preferably a smoothing step of smoothing the conductive thin wires by a calender treatment) after the third step, and to perform a heating step of performing a heating treatment on the conductive film after the smoothing step.

The method for manufacturing a conductive film according to an embodiment of the present invention is not particularly limited. For example, by using an ink containing a metal component and a binder, predetermined conductive thin wires may be printed on a support (examples of the printing method include an ink jet method and the like). The method for manufacturing a conductive film according to the embodiment of the present invention may be a method of preparing a film containing a metal component and a binder on a support in advance, and patterning the film by a known photolithography method.

EXAMPLES

Hereinafter, the present invention will be more specifically described based on examples of the present invention. The materials, the amount and the proportion of the materials used, the contents of procedures, the procedures of treatments, and the like shown in the following examples can be appropriately changed as long as the gist of the present invention is maintained. Accordingly, the scope of the present invention is not limited to the following specific examples.

Example 1

[Preparation of Silver Halide Emulsion]
<Formation of Particles>

The following liquid 1 was prepared and kept at 30° C. and pH 4.5. Then, the following liquid 2 and liquid 3 were prepared according to the composition and the amount described below. The liquid 2 and the liquid 3 in an amount equivalent to 90% by mass of the total amount of each of the liquids were simultaneously added to the liquid 1 for 20 minutes with stirring, thereby obtaining a mixed solution. In the mixed solution, nuclear particles having an average particle size expressed as an equivalent spherical diameter of 0.12 µm were formed. Then, the following liquid 4 and liquid 5 were added to the mixed solution for 8 minutes, and the balance (10% by mass) of the liquid 2 and the liquid 3 was added to the mixed solution for 2 minutes. At this time, in the mixed solution, particles had grown to have an average particle size expressed as an equivalent spherical diameter of 0.15 µm. Thereafter, 0.15 g of potassium iodide was added to the mixed solution, the mixed solution was allowed to mature for 5 minutes, and then the formation of particles ended. Hereinafter, a substance simply called gelatin refers to both the high-molecular-weight gelatin and low-molecular-weight gelatin in the liquid 1.

Liquid 1;
Water: 750 ml
High-molecular-weight gelatin (molecular weight: 300,000): 9 g
Low-molecular-weight gelatin (molecular weight: 15,000): 4.5 g
Sodium chloride: 3 g
1,3-Dimethylimidazolidine-2-thione: 20 mg
Sodium benzene thiosulfonate: 10 mg
Citric acid: 0.7 g
Liquid 2;
Water: 300 ml
Silver nitrate: 150 g
Liquid 3;
Water: 300 ml
Sodium chloride: 38 g
Potassium bromide: 32 g
Potassium hexachloroiridate (III) (content of potassium hexachloroiridate (III): 20% by mass, content of KCl: 0.005% by mass): 8 ml
Ammonium hexachlororhodate (content of ammonium hexachlororhodate: 20% by mass, content of NaCl: 0.001% by mass): 10 ml
Liquid 4;
Water: 100 ml
Silver nitrate: 50 g Liquid 5;
Water: 100 ml
Sodium chloride: 13 g
Potassium bromide: 11 g
Yellow prussiate of potash (potassium hexacyanoferrate (11)). 5 mg <Preparation of Emulsion>

Next, according to a common method, the obtained particles were washed with water by a flocculation method. Specifically, the temperature of the mixed solution was reduced to 35° C., and sulfuric acid was added thereto so as to reduce the pH until silver halide was precipitated (the pH was within a range of 3.6±0.2). Then, the supernatant portion (about 3 L) was removed from the mixed solution (first rinsing). Thereafter. 3 L of distilled water was added to the mixed solution, and sulfuric acid was added thereto until silver halide was precipitated. Subsequently, the supernatant portion (3 L) was removed from the mixed solution (second rinsing). Then, the same operation as the second rinsing was repeated once (third rinsing), thereby obtaining an emulsion. In this way, a rinsing-desalting step was finished. Thereafter, the pH of the obtained emulsion was prepared to 6.4, and pAg of the emulsion was prepared to 7.5. By adding 3.9 g of high-molecular-weight gelatin, 10 mg of sodium benzene thiosulfonate, 3 mg of sodium benzene thiosulfinate, 15 mg of sodium thiosulfate, and 10 mg of chloroauric acid to the emulsion, chemical sensitization was performed such that optimal sensitivity is obtained at 55° C. Subsequently, 100 mg of 1,3,3a,7-tetraazaindene as a stabilizer and 100 mg of PROXEL (trade name, manufactured by ICI Co., Ltd.) as a preservative were added to the emulsion. The finally obtained emulsion was a silver iodochlorobromide cubic particle emulsion which contained 0.08 mol % of silver iodide, silver chlorobromide constituted with silver chloride: silver bromide at a ratio of 70 mol %:30 mol %, and had an average particle diameter of 0.15 µm and a coefficient of variation of 10%.

[Preparation of Silver Halide-Containing Coating Solution 1]

1,3,3a,7-Tetraazaindene ($1.2\times10^{-4}$ mol/mol Ag), hydroquinone ($1.2\times10^{-2}$ mol/mol Ag), citric acid ($3.0\times10^{-4}$ mol/mol Ag), 2,4-dichloro-6-hydroxy-1,3,5-triazine sodium salt (0.90 g/mol Ag), and a trace of hardener were added to the emulsion, thereby obtaining a composition. Then, by using citric acid, the pH of the composition was prepared to 5.6.

Polymer latex, which contained a polymer represented by the following (P-1) (hereinafter, referred to as "P-1"), a dispersant formed of dialkylphenyl PEO (PEO is the abbreviation for polyethylene oxide) sulfuric acid ester, and water (the mass ratio of the content of the dispersant to the content of P-1 (dispersant/P-1, unit: g/g) was 2.0/100=0.02, amount of solid content: 22% by mass), was added to the composition such that the mass ratio of the content of P-1 to the content of the gelatin in the composition (P-1/gelatin, unit: g/g) became 0.2/1, thereby obtaining a polymer latex-containing composition. In the polymer latex-containing composition, a mass ratio R1 of the content of P-1 to the content of silver halide (P-1/silver halide, unit: g/g) was 0.024 (R1 remained the same in the finally obtained silver halide-containing coating solution 1).

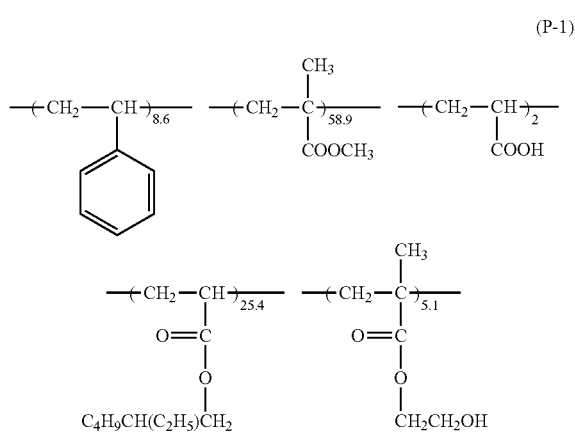

(P-1)

As a crosslinking agent, EPOXY RESIN DY 022 (trade name, manufactured by Nagase ChemteX Corporation) was added to the polymer latex-containing composition, thereby obtaining the silver halide-containing coating solution 1. The amount of the crosslinking agent added was prepared such that the amount of the crosslinking agent in the silver halide-containing photosensitive layer, which will be described later, became 0.09 g/m$^2$.

P-1 was synthesized with reference to Japanese Patent No. 3305459 and Japanese Patent No. 3754745.

[Formation of Conductive Film]

Through the following steps, a conductive film was formed.

<Photosensitive Layer Forming Step (1)>

One surface of a biaxially oriented polyethylene terephthalate (PET) support having a thickness of 40 μm was coated with the composition for forming an undercoat layer, which will be described later, such that the film thickness became 60 nm after drying. The support was dried for 1 minute at 90° C., thereby preparing a support with an undercoat layer. The thickness of the undercoat layer was measured using an electronic micro-film thickness meter manufactured by Anritsu.

(Makeup of Composition for Forming Undercoat Layer (Curable Composition))

The makeup of the composition for forming an undercoat layer is as below.

Acrylic polymer: 66.4 parts by mass
  ("AS-563A", manufactured by Daicel FineChem Ltd., solid content: 27.5% by mass)
Carbodiimide-based crosslinking agent: 16.6 parts by mass
  ("CARBODILITE V-02-L2", manufactured by Nisshinbo Holdings Inc, solid content: 10% by mass)
Colloidal silica: 4.4 parts by mass
  ("SNOWTEX XL", manufactured by Nissan Chemical Co., Ltd., solid content: 10% by mass, liquid obtained by dilution with water)
Lubricant: 27.7 parts by mass
  (carnauba wax, "SELOSOL 524", manufactured by CHUKYO YUSHI CO., LTD., solid content: 3% by mass, liquid obtained by dilution with water)
Anionic surfactant: 23.3 parts by mass
  ("RAPISOL A-90", manufactured by NOF CORPORATION, solid content: 1% by mass, aqueous solution)
Nonionic surfactant: 14.6 parts by mass
  ("NAROACTY CL95", manufactured by Sanyo Chemical Industries, Ltd., solid content: 1% by mass, aqueous solution)
Distilled water: 847.0 parts by mass Then, by simultaneous multilayer coating, the undercoat layer of the support with an undercoat layer was coated with the compositionally prepared coating solution 1 which will be described later, the silver halide-containing coating solution 1, and the compositionally prepared coating solution 2 which will be described later in this order from the side of the undercoat layer at a ratio of coating solution flow rate (compositionally prepared coating solution 1/silver halide-containing coating solution 1/compositionally prepared coating solution 2) of 25/25/1, thereby forming a silver halide-containing photosensitive layer on the support. This film was named film A.

The compositionally prepared coating solution 1 was obtained by preparing a mixed solution by mixing together gelatin and the polymer latex such that the mass ratio of the content of P-1 to the content of the gelatin (content of P-1/content of gelatin, unit: g/g) became 3/1, and adding a dye, which has an optical density of about 1.0 and is decolored by the alkali of a developer which will be described later, to the mixed solution.

The concentration of the compositionally prepared coating solution 1 was prepared such that the content (coating amount) of P-1 in a layer formed of the compositionally prepared coating solution 1 became 0.65 g/m$^2$. The layer formed of the compositionally prepared coating solution 1 has an antihalation function because the layer contains a dye.

The compositionally prepared coating solution 2 was obtained by mixing together gelatin, P-1, and colloidal silica (SNOWTEX ST-C, manufactured by NISSAN CHEMICAL INDUSTRIES, LTD.) such that the mass ratio among the content of the gelatin, the content of P-1, and the content of the colloidal silica (content of P-1/content of colloidal silica/content of gelatin, unit: g/g/g) became 0.5/1.5/1. The concentration of the compositionally prepared coating solution 2 was prepared such that the content of gelatin in a layer formed of the compositionally prepared coating solution 2 became 0.10 g/m$^2$.

In the layer formed of the silver halide-containing coating solution 1, the content of silver was 7.4 g/m$^2$, the content of P-1 was 0.26 g/m$^2$, and the content of gelatin was 1.02 g/m$^2$.

<Exposure and Development Step>

A photomask having the following opening portions was disposed on one surface (the side of the silver halide-containing photosensitive layer) of the film A. Through the photomask, the film A was exposed to parallel light from a high-pressure mercury lamp as a light source. The exposed film A was developed with the following developer and then treated with a fixing solution (trade name: N3X-R for CN16X, manufactured by FUJIFILM Corporation). Then, the treated film A was rinsed with pure water and dried, thereby obtaining a film (film B) constituted with a conductive mesh formed of Ag-containing conductive thin wires (line width: 3 μm) and a layer containing gelatin and P-1 that are formed on a support. The layer containing gelatin and P-1 was formed between the conductive thin wires containing Ag.

(Photomask)

The photomask described above had the following opening portions 1 to 3.

Opening portions 1:
  These opening portions are for forming mesh-like conductive thin wires. The line width of opening portions in the form of lines corresponding to conductive thin wires is 1.0 μm, and the pitch (interval) of the opening portions in the form of lines is 300 μm. In the opening portions 1, the plurality of lines form a square (2 cm×2 cm) mesh.

The number of opening portions 1 disposed on the photomask was 5.

Opening portions 2:

These opening portions are for forming a plurality of lead-out wirings. The opening portions 2 are formed such that the lead-out wirings to be formed are electrically connected to the mesh-like conductive thin wires formed of the opening portions 1 through one end thereof, the width of the lead-out wirings to be formed becomes 10 μm, and the interval between the lead-out wirings to be formed becomes 10 μm.

Opening portions 3:

These opening portions are for forming connection portions. The opening portions 3 are formed such that in the lead-out wirings formed by the opening portions 2, connection portions (size: 0.2 mm×3 mm) to be connected to a flexible printed wiring board are formed at the end that is opposite to the side where the lead-out wirings are electrically connected to the mesh-like conductive thin wires formed by the opening portions 1.

(Composition of Developer)

The composition of the developer is as below.

Hydroquinone: 0.037 mol/L
N-methylaminophenol: 0.016 mol/L
Sodium metaborate: 0.140 mol/L
Sodium hydroxide: 0.360 mol/L
Sodium bromide: 0.031 mol/L
Potassium metabisulfite: 0.187 mol/L <Gelatin Removing Step>

The film B was immersed in an aqueous solution (content of protease: 0.5% by mass, liquid temperature: 40° C.) of a protease ("BIOPRASE AL-15FG" manufactured by Nagase ChemteX Corporation) for 120 seconds. Then, after immersion, the film B was taken out of the aqueous solution of the protease and washed by being immersed in warm water (liquid temperature: 50° C.) for 120 seconds, thereby obtaining a film C (corresponding to a conductive film) having a conductive portion formed by removing gelatin from the conductive mesh constituted with the Ag-containing conductive thin wires (line width: 3 μm) and the layer containing the gelatin and P-1.

(Resistance Reduction Treatment)

By using a calendering device obtained by combining metal rollers and resin rollers, a calender treatment was performed on the film C under a pressure of 30 kN. The film C was then heated by being passed through a superheated steam tank at 150° C. for 120 seconds. The obtained film was named film D.

[Measurement of Metal Exposure Rate (Content of Metal Component)]

For the connection portions of the film D, the metal exposure rate was determined using X-ray photoelectron spectroscopy (XPS). The measurement conditions for XPS are as below.

Device: Versa Probe II manufactured by ULVAC-PHI, INCORPORATED.
X-ray source: monochromatic Al-Ka rays (100 μmf, 25 W, 15 kV)
Photoelectron take-off angle: 45°
Pass Energy: 46.95 eV
Step Energy: 0.05 eV
Time per Step: 20 ms
Correction of charging: performed (using an electron gun and a low-speed ion gun in combination)
Measured atoms (Sweep): C 1s (2), O 1s (2), Ag 3d (2), Si 2s (3), I 3d 5/2 (3), N 1s (2) (measured in this order)
Measurement area: 500 mm$^2$ (area analysis)

The depth resolution of XPS is about 10 nm from surface. The metal exposure rate was calculated as total number of metal atoms/total number of atoms. Metal atoms mean atoms of group 4 to group 12 on the periodic table. Total number of atoms means the number obtained by adding the number of atoms of B, C, N, O, F Si, P, S, Cl, Br, and I to the number of metal atoms.

In calculating the metal exposure rate, among the atoms detected by XPS, atoms whose content was less than 0.02 at % were ignored. That is, the metal exposure rate was calculated from the metal atoms and the atoms whose content was equal to or greater than 0.02 at % among B, C, N, O, F Si, P, S, Cl, Br, and I.

The metal exposure rate of the connection portions in the film D was 5 at %.

[Calculation of Metal Exposure Rate in Surface Layer Region]

Then, the connection portions of the film D were cut with a microtome by the following method. By using a scanning electron microscope S-5500 manufactured by Hitachi High-Technologies Corporation (acceleration voltage: 2 kV, magnification for observation: 30,000X, reflection electron image), the cut surface was observed, and a cross-sectional scanning electron micrograph (SEM) was captured. Within the obtained vertical cross-sectional image of the connection portions, an area ratio (%) ({(area of metal component)/(area of region as observation target)}×100) of a metal component was calculated in a region determined in a case where the contour of the surface shape of a surface X of the connection portions that is opposite to the side of the support was moved 5 nm toward the side of the support. The measurement described above was performed at 10 random sites, and the arithmetic mean of the obtained area ratios was calculated, thereby determining an average area ratio (corresponding to the metal exposure rate of the surface layer region).

For calculating the area ratio, by using image processing software ImageJ, binarization was performed such that the metal component in the cross-sectional SEM image was converted into white (gray value=255) and the binder portion was converted into black (gray value=0). Furthermore, a mean gray value of the region as an observation target was measured, the measured value was divided by 255, and the result was multiplied by 100, thereby obtaining a metal exposure rate (%). The results are described in the column of "Metal exposure rate (%) surface layer region" in Table 1.

Example 2

A conductive film (corresponding to the film D) having undergone the resistance reduction treatment was obtained in the same manner as in Example 1, except that in Example 1, instead of the compositionally prepared coating solution 2, a compositionally prepared coating solution 3 was used which was obtained by mixing together the aforementioned polymer latex, gelatin, and colloidal silica such that the mass ratio among the content of the gelatin, the content of P-1, and the content of the colloidal silica (content of P-1/content of colloidal silica/content of gelatin, unit: g/g/g) became 1.3/1.5/1. The metal exposure rate of the connection portions of the conductive film was 0.5 at %.

Example 3

A conductive film (corresponding to the film D) having undergone the resistance reduction treatment was obtained in the same manner as in Example 1, except that in Example 1, instead of the compositionally prepared coating solution 2, a compositionally prepared coating solution 4 was used which was obtained by mixing together the aforementioned polymer latex, gelatin, and colloidal silica such that the mass ratio among the content of the gelatin, the content of P-1, and the content of the colloidal silica (content of P-1/content of colloidal silica/content of gelatin, unit: g/g/g) became 0.3/0.9/1. The metal exposure rate of the connection portions of the conductive film was 9.5 at %.

Comparative Example 1

A conductive film (corresponding to the film D) having undergone the resistance reduction treatment was obtained in the same manner as in Example 1, except that in Example 1, instead of the compositionally prepared coating solution 2, a compositionally prepared coating solution 5 was used which was obtained by mixing together the aforementioned polymer latex, gelatin, and colloidal silica such that the mass ratio among the content of the gelatin, the content of P-1, and the content of the colloidal silica (content of P-1/content of colloidal silica/content of gelatin, unit: g/g/g) became 2/1.5/1. The metal exposure rate of the connection portions of the conductive film was 0.1 at %.

Comparative Example 2

A conductive film (corresponding to the film D) having undergone the resistance reduction treatment was obtained in the same manner as in Example 1, except that in Example 1, instead of the compositionally prepared coating solution 2, a compositionally prepared coating solution 6 was used which was obtained by mixing together the aforementioned polymer latex, gelatin, and colloidal silica such that the mass ratio among the content of the gelatin, the content of P-1, and the content of the colloidal silica (content of P-1/content of colloidal silica/content of gelatin, unit: g/g/g) became 0/0.1/1. The metal exposure rate of the connection portions of the conductive film was 25.0 at %.

Example 4

The conductive film of Comparative Example 2 was coated with the aqueous solution of the polymer latex described above, thereby proving an overcoat. The metal exposure rate of the connection portions was 0.5 at %.

[Measurement of Environmental Durability]

For each of the obtained conductive films, the environmental durability was measured by the following method.

In a case where the environmental durability is low, the metal on the surface of the connection portions is corroded by oxygen, chlorine, sulfur, and the like in the air. Accordingly, electrical resistivity between a printed wiring board and the connection portions of the film D (or the conductive film of a comparative example corresponding to the film D) that are bonded to each other through ACF increases. Immediately after the manufacturing (fresh) of the film D (or the conductive film of a comparative example corresponding to the film D) and after the film D was left to stand for 2 months in a room at a room temperature and a normal humidity (after lapse of time), a printed wiring board manufactured by TAIYO KOGYO CORPORATION and the connection portions were joined to each other by compression bonding through CP920CM-25AC (AFC manufactured by Dexerials Corporation). The compression bonding was performed for 10 seconds under the conditions of 150° C. and 1.0 MPa (conditions recommended by the manufacturer). Based on an increase rate of electrical resistivity in the printed wiring board-connection portions of film D (or the conductive film of a comparative example corresponding to the film D) of "after lapse of time" with respect to "fresh", the environmental durability of the film D was evaluated. The evaluation standards are as below. The results are shown in Table 1.

A: the increase rate of the electrical resistivity was less than 10%.

B: the increase rate of the electrical resistivity was equal to or higher than 10% and less than 20%.

C: the increase rate of the electrical resistivity was equal to or higher than 20%.

[ACF Adhesion Reliability]

Through CP920CM-25AC (AFC manufactured by Dexerials Corporation), a printed wiring board manufactured by TAIYO KOGYO CORPORATION and the connection portions of the film D (fresh) were joined to each other by compression bonding, thereby obtaining a laminate. Here, in order to enforcedly evaluate the ACF adhesion reliability, the compression bonding conditions were wet to be 100° C., 0.5 MPa, and 10 seconds such that compression became weaker than that performed under the conditions recommended by the manufacturer. The electrical resistivity between the printed wiring board and the connection portions of the film D (or the conductive film of a comparative example corresponding to the film D) was measured immediately after the compression bonding. Then, for the laminate described above, a moisture-heat reliability test (60° C., 90%, 10 days) was performed. Thereafter, the electrical resistivity between the printed wiring board and the connection portions of the film D (or the conductive film of a comparative example corresponding to the film D) was measured. Based on an increase rate of the electrical resistivity before and after the moisture-heat reliability test, the ACF adhesion reliability was evaluated. The evaluation standards are as below. The results are shown in Table 1.

A: the increase rate of the electrical resistivity was less than 5%.

B: the increase rate of the electrical resistivity was equal to or higher than 5% and less than 10%.

C: the increase rate of the electrical resistivity was equal to or higher than 10%.

The increase of the electrical resistivity after the moisture-heat reliability test shows that the adhesion reliability between the connection portions of the conductive film and ACF is low, in other words, peeling occurred between the connection portions of the conductive film and ACF after the moisture-heat reliability test.

TABLE 1

|  | Metal exposure rate (at %) | Metal exposure rate in surface layer region (%) | Environmental durability | ACF adhesion reliability |
|---|---|---|---|---|
| Example 1 | 5 | 5 | A | A |
| Example 2 | 0.5 | 1.0 | A | A |
| Example 3 | 9.5 | 10 | B | A |
| Example 4 | 0.5 | 0 | A | B |
| Comparative Example 1 | 0.1 | 0 | A | C |
| Comparative Example 2 | 25 | 25 | C | A |

As shown in the results in Table 1, conductive films of Examples 1 to 4 had the effects of the present invention. In contrast, the conductive film of Comparative Example 1 having a metal exposure rate of 0.10 at % had poor ACF adhesion reliability. Furthermore, the conductive film of Comparative Example 2 having a metal exposure rate of 25 at % had poor environmental durability.

The conductive film of Example 1 having a metal exposure rate equal to or lower than 8.0 at % had environmental durability higher than that of the conductive film of Example 3 having a metal exposure rate of 9.5 at %.

The conductive film of Example 2 in which the area ratio of a metal component was within a range of 0.5% to 8% had ACF adhesion reliability higher than that of the conductive film of Example 4. Furthermore, the conductive film of Example 2 had environmental durability higher than that of the conductive film of Example 3.

EXPLANATION OF REFERENCES

10: conductive film
11: support
12: first detection electrode
13: first lead-out wiring
14: first connection portion
15: second detection electrode
16: second lead-out wiring
17: second connection portion
21: first conductive thin wire
22: second conductive thin wire

What is claimed is:

1. A conductive film comprising:
   a support;
   detection electrodes that are arranged on at least one main surface of the support;
   connection portions that are arranged on the main surface so as to be electrically connected to an external terminal; and
   lead-out wirings that are arranged on the main surface, electrically connected to the detection electrodes through one end portion thereof, and electrically connected to the connection portions through the other end portion thereof,
   wherein the connection portions contain a binder and a metal component, and
   a content of the metal component in the connection portions that is determined by X-ray photoelectron spectroscopy is 0.5 to 10 at %.

2. The conductive film according to claim 1,
   wherein at least one kind of member selected from the group consisting of the lead-out wirings and the detection electrodes further contains the binder and the metal component.

3. The conductive film according to claim 1,
   wherein the detection electrodes are formed of mesh-like conductive thin wires containing the binder and the metal component.

4. The conductive film according to claim 1,
   wherein the metal component contains at least one kind of atom selected from the group consisting of gold, silver, copper, nickel, palladium, tungsten, molybdenum, and chromium.

5. The conductive film according to claim 1,
   wherein an area ratio of the metal component in a cross section of the connection portions ranging from a surface of the connection portions to a position 5 nm below the surface in a thickness direction is 0.5% to 8%.

6. The conductive film according to claim 2,
   wherein the detection electrodes are formed of mesh-like conductive thin wires,
   wherein the connection portions and lead-out wirings and the detection electrodes contain a binder and a metal component which contains at least one kind of atom selected from the group consisting of gold, silver, copper, nickel, palladium, tungsten, molybdenum, and chromium, and
   wherein an area ratio of the metal component in a cross section of the connection portions ranging from a surface of the connection portions to a position 5 nm below the surface in a thickness direction is 0.5% to 8%.

7. A touch panel comprising:
   the conductive film according to claim 1.

8. A method for manufacturing the conductive film according to claim 1 in which the binder contains a polymer and the metal component contains metal silver, the method comprising:
   a step of forming a silver halide-containing photosensitive layer by coating a support with a silver halide-containing coating solution, which contains silver halide, gelatin, and a polymer different from the gelatin, and a compositionally prepared coating solution, which contains a polymer different from the gelatin, by simultaneous multilayer coating;
   a step of forming silver-containing connection portions by exposing the silver halide-containing photosensitive layer and then performing a development treatment on the photosensitive layer; and
   a step of obtaining the conductive film by removing the gelatin from the connection portions.

* * * * *